United States Patent
Kim et al.

(10) Patent No.: US 7,304,359 B2
(45) Date of Patent: Dec. 4, 2007

(54) MAGNETIC TUNNEL JUNCTION STRUCTURE WITH AMORPHOUS NIFESIB FREE LAYER

(75) Inventors: Young-Keun Kim, Seoul (KR); Byong-Sun Chun, Seoul (KR); Jang-Roh Rhee, Seoul (KR); Jae-Youn Hwang, Seoul (KR)

(73) Assignee: Korea University Foundation (KR)

( * ) Notice: Subject to any disclaimer, the term of this patent is extended or adjusted under 35 U.S.C. 154(b) by 51 days.

(21) Appl. No.: 11/240,162

(22) Filed: Sep. 30, 2005

(65) Prior Publication Data
US 2006/0202290 A1    Sep. 14, 2006

(30) Foreign Application Priority Data
Mar. 9, 2005 (KR) ............ 10-2005-0019395
Mar. 9, 2005 (KR) ............ 10-2005-0019402

(51) Int. Cl.
*H01L 29/82* (2006.01)
(52) U.S. Cl. ................... 257/421; 360/324.2
(58) Field of Classification Search ........ 257/421–427, 257/108; 360/324.2
See application file for complete search history.

(56) References Cited

U.S. PATENT DOCUMENTS

| | | | |
|---|---|---|---|
| 4,385,932 A * | 5/1983 | Inomata et al. | 148/304 |
| 6,381,107 B1 * | 4/2002 | Redon et al. | 360/324.2 |
| 2004/0257719 A1 | 12/2004 | Ohba et al. | |
| 2004/0262654 A1 | 12/2004 | Ohba et al. | |

FOREIGN PATENT DOCUMENTS

| | | |
|---|---|---|
| JP | 2004022599 | 1/2004 |
| JP | 2004179187 | 6/2004 |

OTHER PUBLICATIONS

European Search Report dated Jul. 14, 2006 with Written Opinion received in corresponding European Patent Application No. 05 02 0920.4 (8 pages).
Chun, et al., "Magnetization switching and tunneling magnetoresistance effects of synthetic antiferromagnet free layers consisting of amorphous NiFeSiB" Applied Physics Letters vol. 87, 2005 (3 pages).
Kim, "Magnetic tunnel junctions comprising amorphous NiFeSiB and CoFeSiB free layers" Journal of Magnetism and Magnetic Materials 304, 2006 (4 pages).
Chun, et al., "Magnetization switching of NiFeSiB free layers for magnetic tunnel junctions" Journal of Magnetism and Magnetic Materials 304, 2006 (3 pages).

(Continued)

*Primary Examiner*—Kenneth Parker
*Assistant Examiner*—Jami M. Valentine
(74) *Attorney, Agent, or Firm*—Grossman, Tucker, Perreault & Pfleger, PLLC (57) ABSTRACT

A magnetic tunnel junction (MTJ) structure for a magnetic random access memory (MRAM) is provided. Specifically, an MTJ structure with an amorphous CoFeSiB or NiFeSiB free layer is provided. The free layer is a CoFeSiB single layer, a NiFeSiB single layer, a CoFeSiB/Ru/CoFeSiB SAF layer, or a NiFeSiB/Ru/NiFeSiB SAF layer.

2 Claims, 7 Drawing Sheets

OTHER PUBLICATIONS

Hwang, et al., "Tunneling magnetoresistance and magnetization switching of CoFeSiB free layered magnetic tunnel junctions" Journal of Magnetism and Magnetic Materials 303, 2006 (3 pages).

Chun, et al., "Magnetization switching of CoFeSiB free-layered magnetic tunnel junctions" Journal of Magnetism and Magnetic Materials 303, 2006 (3 pages).

Shirae "Noise in amorphous magnetic materials" IEEE Transactions on Magnetics, vol. Mag-20, No. 5, Sep. 1984 (3 pages).

Moodera, et al., "Large Magnetoresistance at Room Temperature in Ferromagnetic Thin Film Tunnel Junctions", Physical Review Letters, Apr. 17, 1995, vol. 74, No. 16, The American Physical Society (4 pages).

Gallagher, et al., "Microstructured Magnetic Tunnel Junctions (invited)", Symposium on Magnetoelectric Devices for Information Storage, Apr. 15, 1997, vol. 81, No. 8, American Institute of Physics (6 pages).

* cited by examiner

MAGNETIC TUNNEL JUNCTION STRUCTURE WITH AMORPHOUS NIFESIB FREE LAYER

PRIORITY

This application claims priority under 35 U.S.C. § 119 to applications entitled "Magnetic Tunnel Junctions Employing Amorphous CoFeSiB Free Layer" filed in the Korean Intellectual Property Office on Mar. 9, 2005 and assigned Ser. No. 2005-0019395 and "Magnetic Tunnel Junctions Employing Amorphous NiFeSiB Free Layer" filed in the Korean Intellectual Property Office on Mar. 9, 2005 and assigned Ser. No. 2005-0019402, the contents of which are herein incorporated by reference.

BACKGROUND OF THE INVENTION

1. Field of the Invention

The present invention relates generally to a magnetic tunnel junction structure for a magnetic random access memory (MRAM), and in particular, to a magnetic tunnel junction structure with an amorphous CoFeSiB or NiFeSiB free layer.

2. Description of the Related Art

A magnetic random access memory (hereinafter, referred to as an MRAM) has been used in military applications, such as missiles and spaceships. In addition, there is a strong possibility that the MRAM will be used as a substitute for an existing memory of portable phones, computers, and so on. This MRAM is a magnetic storage device that has magnetic tunnel junctions (MTJs) based on a tunneling magnetoresistance (TMR).

An MTJ structure includes an insulating layer (generally $Al_2O_3$ or MgO) and two ferromagnetic layers. The insulating layer serving as a tunneling barrier is interposed between the two ferromagnetic layers. A current flows vertically to the respective layers. The two ferromagnetic layers are a pinned layer acting as a reference layer and a free layer performing a storing and sensing function. When a current flows, if the spin orientations of the two ferromagnetic layers are equal to each other, a parallel resistance is small and a current tunneling probability increases. On the contrary, when the spin orientations are antiparallel, a resistance is large and a current tunneling probability decreases. That is, a tunneling current in the MTJs depends on a relative magnetization orientation of the two ferromagnetic layers. This phenomenon was first observed experimentally by Julliere in 1975. This phenomenon is referred to as a tunneling magnetoresistance (TMR).

MTJs have a promise in high density read head and MRAM applications because they exhibit large TMR ratios (J. S. Moodera, L. R. Kinder, T. M. Wong, and R. Meservey, Phys. Rev. Lett. 74, 3273 (1995), W. J. Gallagher, S. S. P. Parkin, Yu Lu, X. P. Bian, A. Marley, K. P. Roche, R. A. Altman, S. A. Rishton, C. Jahnes, T. M. Shaw, and Gang Xiao, J. Appl. Phys. 81, 3741 (1997)).

In the MRAM, the core technology in device implementation is the development of thin film materials exhibiting excellent and stable magnetoresistance properties, and the integration process using existing semiconductor circuits. From these points of view, magnetoresistance films (i.e., MTJs) exhibiting TMR phenomenon are considered as film materials that are most suitable for the development of excellent non-volatile MRAMs.

Accordingly, the interactions between the two ferromagnetic (pinned and free) layers are very important particularly in the switching characteristics of the high density MRAM with submicrometer-sized MTJ cells. A smaller cell, however, requires a larger switching field ($H_{SW}$) because a large demagnetizing field arises from the poles of the submicrometer-sized cell edge, leading to large write currents. That is, a writing margin needs to be assured in forming the submicrometer-sized cells. When the size of the cell is reduced to less than micrometers, a demagnetizing field is generated so that the writing margin is reduced. The writing margin is greatly influenced by a physical property of the ferromagnet itself. In order to assure the writing margin, a low switching field is required.

In addition, a reading margin needs to be assured in forming the submicrometer-sized cells. The reading margin is greatly influenced by a TMR ratio. In order to assure the reading margin, a large TMR ratio is required.

Accordingly, as the size of the cell is reduced, MTJs need to have a low switching field and a large TMR ratio. In addition, a free layer for these MTJs must be provided.

SUMMARY OF THE INVENTION

An object of the present invention is to substantially solve at least the above problems and/or disadvantages and to provide at least the advantages below. Accordingly, an object of the present invention is to provide an MTJ structure with a low switching field and a large TMR ratio.

Another object of the present invention is to provide an MTJ structure with a low switching field and a large TMR ratio, which includes a free layer that does not have a plurality of domains.

According to one aspect of the present invention, there is provided an MTJ structure having a free layer and a pinned layer separated by a non-magnetic layer. In the MTJ structure, a free layer includes an amorphous CoFeSiB ferromagnetic layer or an amorphous NiFeSiB ferromagnetic layer. An intermediate layer is formed of non-magnetic material on the free layer. A pinned layer is formed of a ferromagnetic layer on the intermediate layer.

In addition, embodiments other than the above-described MTJ structure can also be provided, and modifications or additions of the elements are possible.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will be described herein below with reference to the accompanying drawings. In the following description, well-known functions or constructions are not described in detail since they would obscure the invention in unnecessary detail.

Figure 1A:
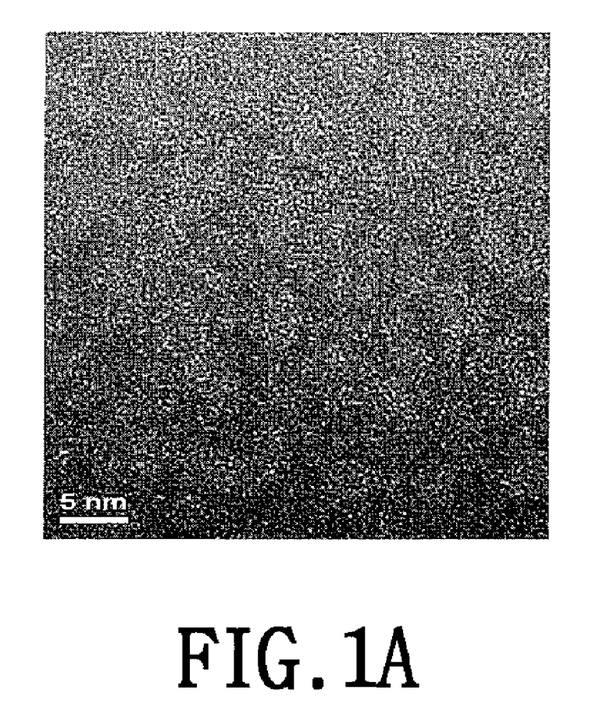
FIG. 1(a) is a transmission electron microscope (TEM) photograph of a NiFeSiB film.
Figure 1B:
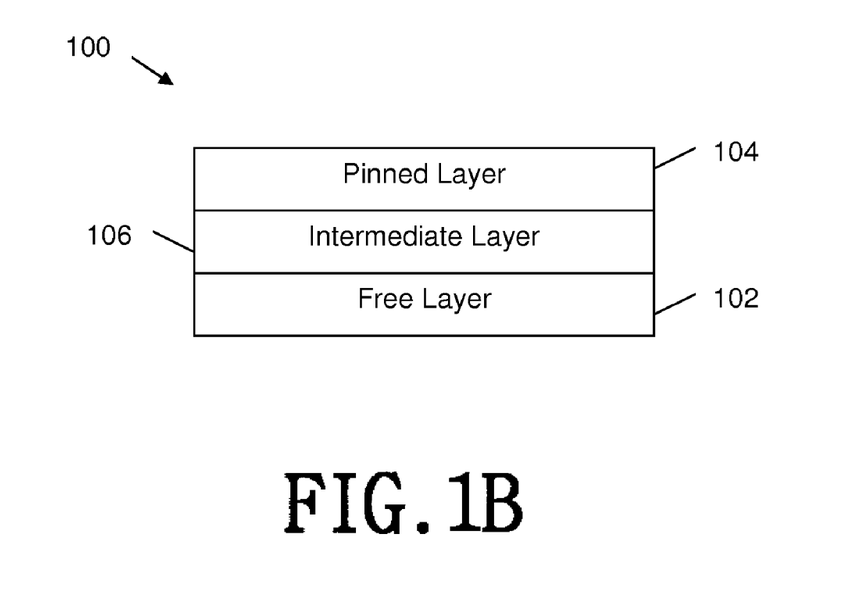
FIG. 1(b) diagrammatically illustrates an exemplary MJT structure consistent with the present disclosure.

FIG. 1B diagrammatically illustrates an MJT structure 100 according to one aspect of the present disclosure. As shown, the structure includes a free layer 102 and a pinned layer 104 separated by an intermediate layer 106 of non-magnetic material. The free layer 102 may include an amorphous CoFeSiB ferromagnetic layer or an amorphous NiFeSiB ferromagnetic layer. The intermediate layer 106 is formed on the free layer 102. The pinned layer 104 is formed of a ferromagnetic layer on the intermediate layer 106.

The present invention is intended to provide an MTJ structure with an amorphous CoFeSiB or NiFeSiB free layer.

The MTJ structure according to the present invention is a Si/SiO$_2$/Ta (45 nm)/Ru (9.5 nm)/IrMn (10 nm)/CoFe (7 nm)/AlO$_x$/{CoFeSiB (7 nm) single layer or a CoFeSiB (t nm)/Ru (1.0 nm)/CoFeSiB (7−t nm) synthetic layer} (8.0 nm)/Ru (60 nm) and Another structure is a Si/SiO$_2$/Ta (45 nm)/Ru (9.5 nm)/IrMn (10 nm)/CoFe (7 nm)/AlO$_x$/{NiFeSiB (7 nm) single layer or a NiFeSiB (t nm)/Ru (0.5 nm)/NiFeSiB (7−t nm) synthetic layer} (7.5 nm)/Ru (60 nm).

That is, a conventional CoFe and/or NiFe layer used as an MTJ free layer is replaced with a CoFeSiB or NiFeSiB free layer.

In the fabrication of the MTJ structure according to the present invention, a DC magnetron sputtering is used to deposit thin films, and a base pressure is less than 5×10$^{-8}$ Torr. A magnetic field (growth magnetic field) of 100 Oe is applied during deposition to induce uniaxial magnetic anisotropy in the ferromagnetic layers. Tunnel barriers (AlO$_x$) are formed by oxidizing 1.0-nm-thick Al layers under an RF plasma environment in a chamber. A photolithographic patterning procedure including ion beam etching is used to fabricate the junctions. The sample size is varied from 10×10 μm$^2$ to 100×100 μm$^2$ with an aspect ratio of unity (1). Annealing is carried out at 200° C. in a 5×10$^{-4}$ Torr vacuum under an applied field of 300 Oe for 2 hours.

Hereinafter, the preferred embodiments of the present invention will be described in detail with reference to the accompanying drawings.

FIG. 1(a) is a transmission electron microscope (TEM) photograph of a NiFeSiB film. From this photograph, it can be seen that a NiFeSiB film used as a free layer is amorphous. Specifically, composition of the NiFeSiB film is Ni$_{16}$Fe$_{62}$Si$_8$B$_{14}$.

Figure 2:
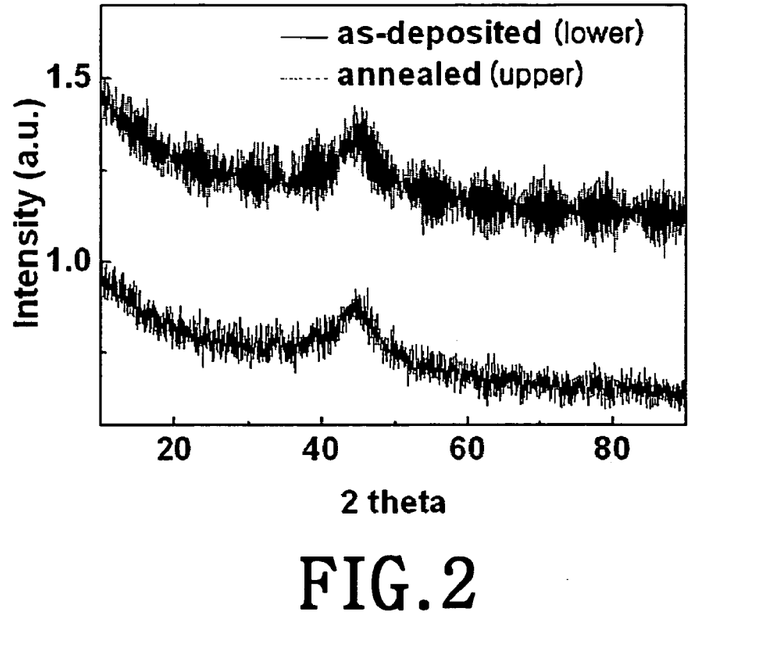
FIG. 2 is a graph of an X-ray pattern illustrating a deposited state and an annealed state of a NiFeSiB layer.

FIG. 2 is a graph of an X-ray pattern illustrating a deposited state and an annealed state of the NiFeSiB film. As can be seen from FIG. 2, the NiFeSiB film is amorphous in both the deposited state and the annealed state.

Figure 3:
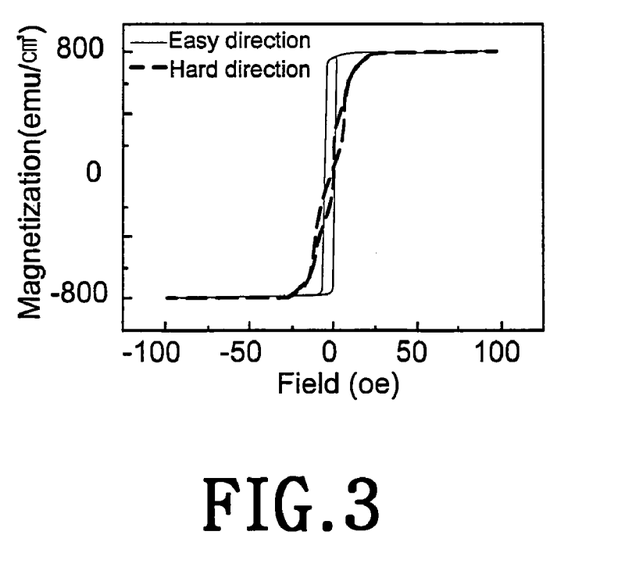
FIG. 3 is an M-H curve illustrating a magnetization property of NiFeSiB.

FIG. 3 is an M-H curve illustrating a magnetization property of NiFeSiB. The M-H curve shows a result obtained by measuring a magnetic property of NiFeSiB using a vibrating sample magnetometer (VSM). That is, saturation magnetization (M$_s$) of NiFeSiB is 800 emn/cm$^3$ and anisotropy constant (K$_u$) is 2700 erg/cm$^3$. This means that NiFeSiB exhibits lower saturation magnetization and higher anisotropy constant than CoFe or NiFe.

Figure 4:
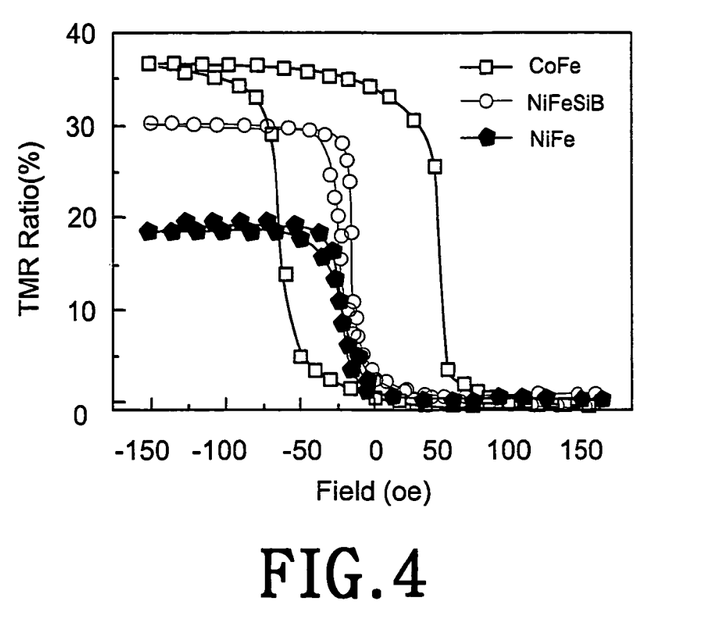
FIG. 4 is a magnetoresistance curve for comparing TMR ratios of NiFeSiB, CoFe, and NiFe MTJ structures.

FIG. 4 is a magnetoresistance curve for comparing TMR ratios of NiFeSiB, CoFe, and NiFe MTJ structures. A TMR ratio of an MTJ structure with a NiFeSiB free layer is lower than that of an MTJ structure with a CoFe free layer and is higher than that of an MTJ structure with a NiFe free layer. The use of the CoFe free layer, however, incurs a problem in that a switching field is high. The use of the NiFe free layer has advantage in that a switching field is low, but a TMR ratio is low. Thus, the use of the NiFe free layer is not preferred.

Figure 5:
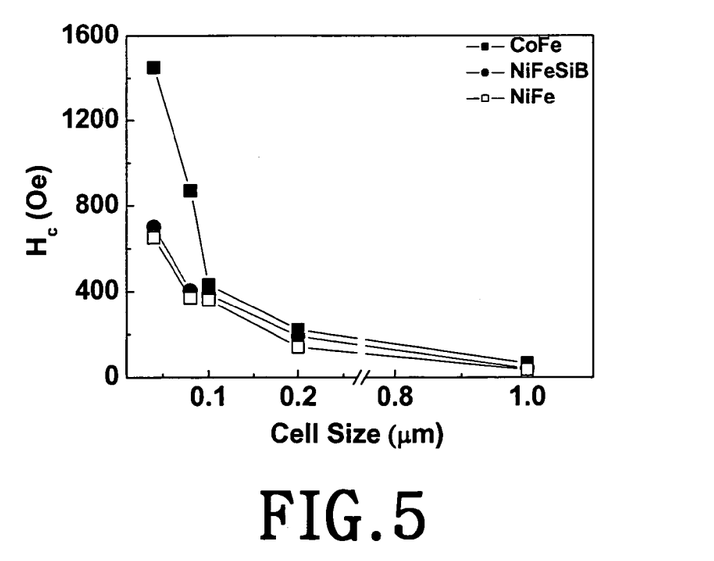
FIG. 5 is a graph illustrating a change of a switching field according to cell sizes of NiFeSiB, CoFe, and NiFe MTJ structures.

FIG. 5 is a graph illustrating a change of a switching field according to cell sizes of NiFeSiB, CoFe, and NiFe MTJ structures. As can be seen from FIG. 5, a switching field of NiFeSiB is less than half that of CoFe in a cell size of 0.04-0.08 micrometer.

Figure 6:
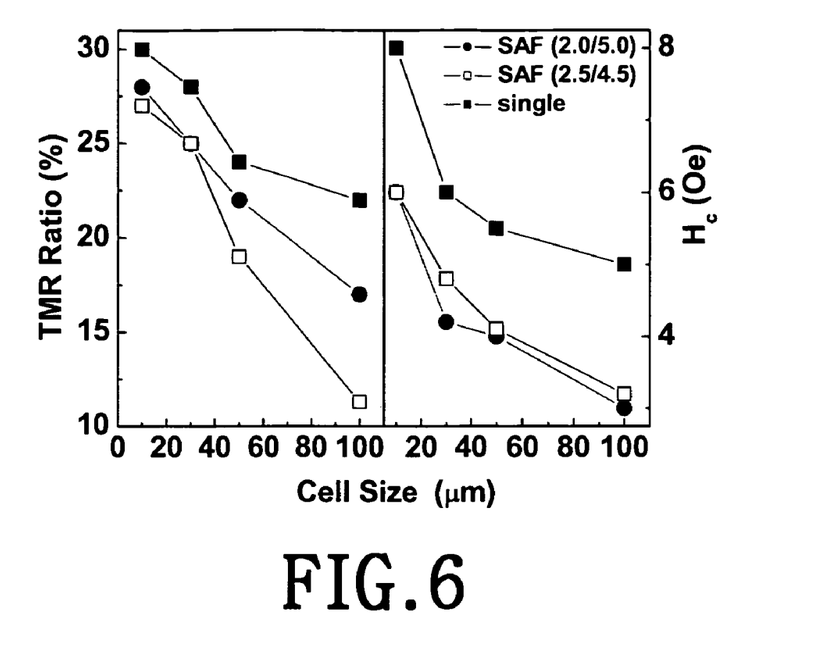
FIG. 6 is a graph illustrating change of a TMR ratio and switching field according to cell sizes of an MTJ structure with a NiFeSiB single free layer and an MTJ structure with a NiFeSiB/Ru/NiFeSiB SAF free layer.

FIG. 6 is a graph illustrating change of a TMR ratio and switching field according to cell sizes of an MTJ structure with a NiFeSiB single free layer and an MTJ structure with a NiFeSiB/Ru/NiFeSiB synthetic antiferromagnet (SAF) free layer. The synthetic antiferromagnet structure has a thickness difference in two kinds of MTJs with a NiFeSiB/Ru/NiFeSiB free layer, that is, NiFeSiB (2.0 nm)/Ru (0.5 nm)/NiFeSiB (5.0 nm) and NiFeSiB (2.5 nm)/Ru (0.5 nm)/NiFeSiB (4.5 nm). In the case of the NiFeSiB single free layer, a TMR ratio is 30% and a switching field (H$_{SW}$) is 8 Oe. In the case of the NiFeSiB (2.0 nm)/Ru (0.5 nm)/NiFeSiB (5.0 nm) SAF free layer, a TMR ratio is 28% and a switching field (H$_{SW}$) is 6 Oe. In the case of the NiFeSiB (2.5 nm)/Ru (0.5 nm)/NiFeSiB (4.5 nm) SAF free layer, a TMR ratio is 27% and a switching field (H$_{SW}$) is 6 Oe. In an entire band, the NiFeSiB (2.0 nm)/Ru (0.5 nm)/NiFeSiB (5.0 nm) SAF free layer and the NiFeSiB (2.5 nm)/Ru (0.5 nm)/NiFeSiB (4.5 nm) SAF free layer have smaller TMR ratio and lower switching field than the NiFeSiB single free layer.

Figure 7:
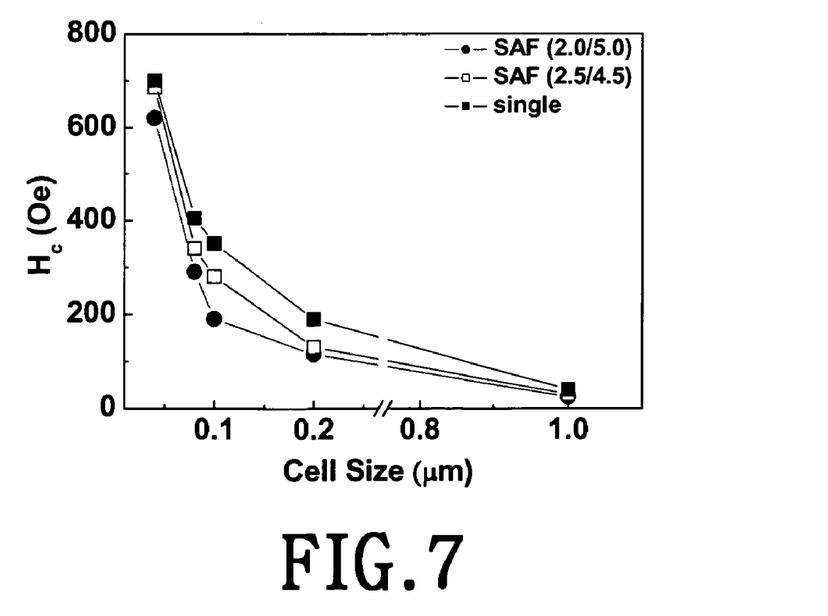
FIG. 7 is a graph illustrating a change of a switching field according to cell sizes of MTJ structure with a NiFeSiB single free layer and an MTJ structure with a NiFeSiB/Ru/NiFeSiB SAF free layer.

FIG. 7 is a graph illustrating a change of a switching field according to cell sizes of an MTJ structure with a NiFeSiB single free layer and an MTJ structure with a NiFeSiB/Ru/NiFeSiB SAF free layer. As illustrated in FIG. 7, the MTJ structure with the NiFeSiB single free layer has a switching field similar to that of the MTJ structure with the NiFeSiB/Ru/NiFeSiB SAF free layer.

Figure 8:
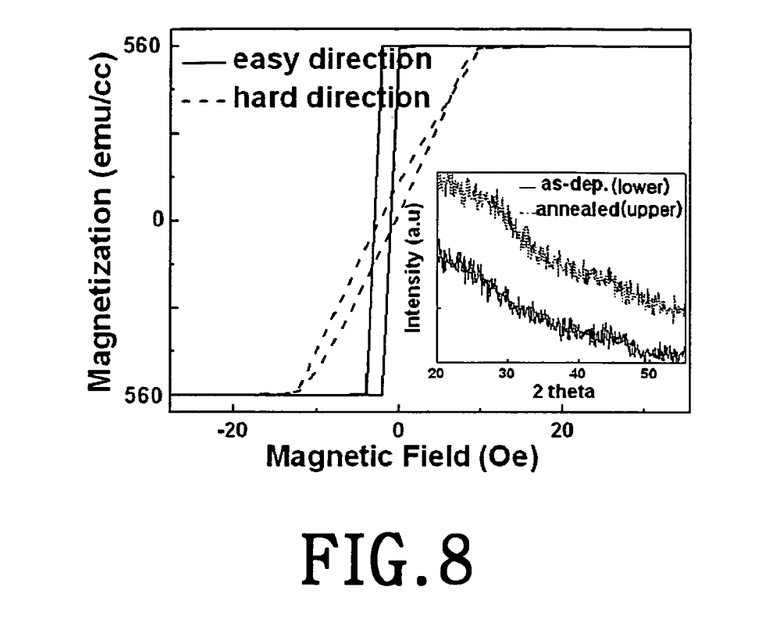
FIG. 8 is an M-H curve illustrating a magnetization property of an amorphous CoFeSiB film.

FIG. 8 is an M-H curve illustrating a magnetization property of amorphous CoFeSiB film. Specifically, composition of the CoFeSiB film is Co$_{70.5}$Fe$_{4.5}$Si$_{15}$B$_{10}$. The each composition of the amorphous CoFeSiB layer can between +5% and −5% of Co$_{16}$Fe$_{62}$Si$_8$B$_{14}$ This M-H curve is a result obtained by measuring a magnetic property of CoFeSiB using a VSM. That is, saturation magnetization (Ms) of CoFeSiB is 560 emn/cm$^3$ and anisotropy constant (K$_u$) is 2800 erg/cm³. This means that CoFeSiB exhibits lower saturation magnetization than CoFe and higher anisotropy constant than NiFe. A small box within FIG. 8 is an X-ray pattern showing that a deposited state and an annealed state of the CoFeSiB film are all amorphous.

Figure 9A:
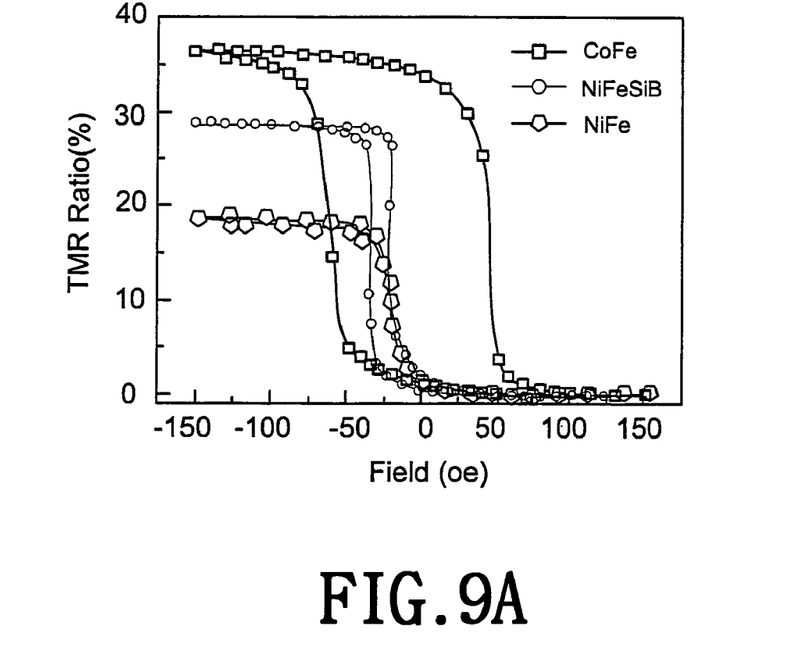
FIGS. 9(a) and 9(b) are a magnetoresistance curve for comparing TMR ratios of CoFeSiB, CoFe, and NiFe MTJ structures, and a magnetoresistance curve for comparing TMR ratios of CoFeSiB and CoFeSiB/Ru/CoFeSiB SAF MTJ structures, respectively.
Figure 9B:
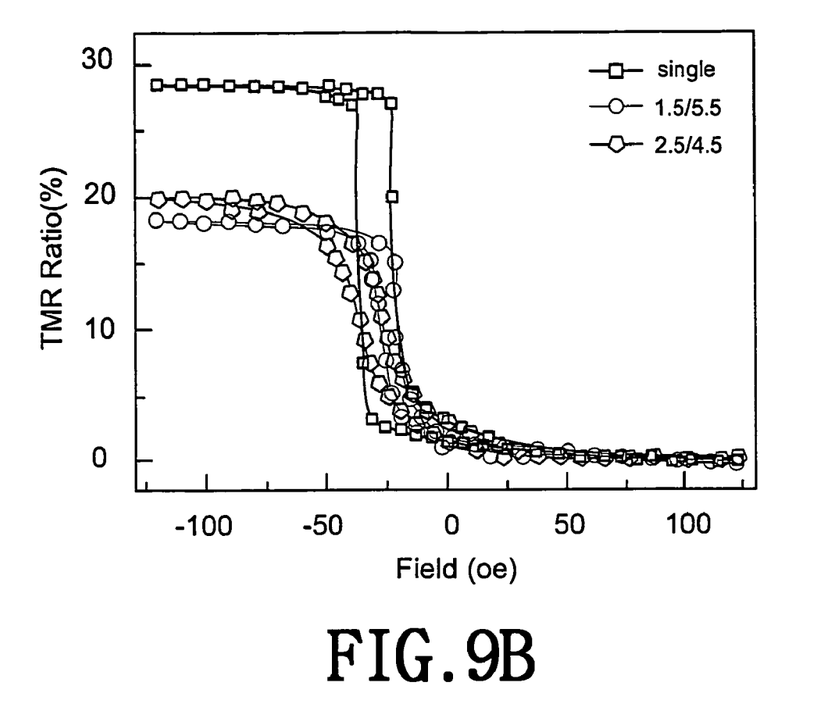

FIG. 9(a) is a magnetoresistance curve for comparing TMR ratios of CoFeSiB, CoFe, and NiFe MTJ structures, and FIG. 9(b) is a magnetoresistance curve for comparing TMR ratios of CoFeSiB and CoFeSiB/Ru/CoFeSiB SAF MTJ structures. Referring to FIG. 9(a), a TMR ratio of an MTJ structure with a CoFeSiB free layer is lower than that of an MTJ structure with a CoFe free layer and is higher than that of an MTJ structure with a NiFe free layer. The use of the CoFe layer, however, incurs a problem in that a switching field is high. The use of the NiFe layer has advantage in that a switching field is low, but a TMR ratio is low. Thus, the use of the NiFe layer is not preferred. Referring to FIG. 9(b), an MTJ structure with a CoFeSiB single free layer has a higher switching field than an MTJ structure with a CoFeSiB (1.5 nm)/Ru (1.0 nm)/CoFeSiB (5.5 nm) SAF free layer and an MTJ structure with a CoFeSiB (2.5 nm)/Ru (1.0 nm)/CoFeSiB (4.5 nm) SAF free layer.

Figure 10:
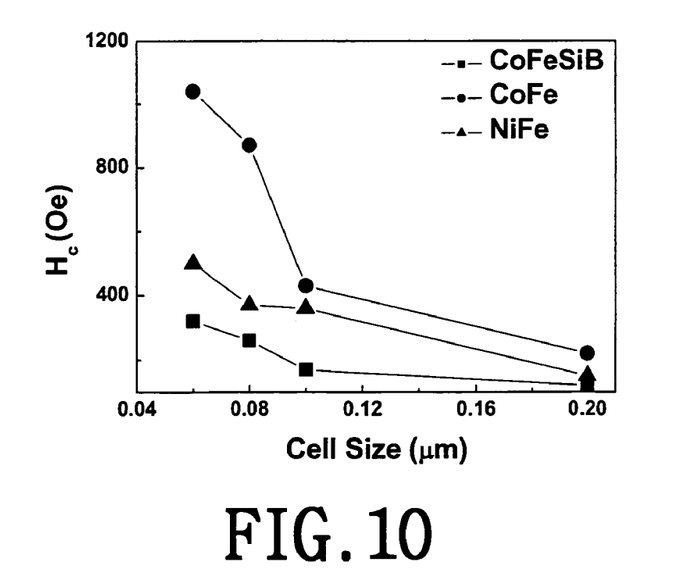
FIG. 10 is a graph illustrating a change of a switching field according to cell sizes of CoFeSiB, CoFe, and NiFe TMJ structures.

FIG. 10 is a graph illustrating a change of a switching field according to cell sizes of CoFeSiB, CoFe, and NiFe MTJ structures. As can be seen from FIG. 10, a switching field of CoFeSiB is less than half that of CoFe and is lower than NiFe in a cell size of 0.04-0.08 micrometer.

Figure 11:
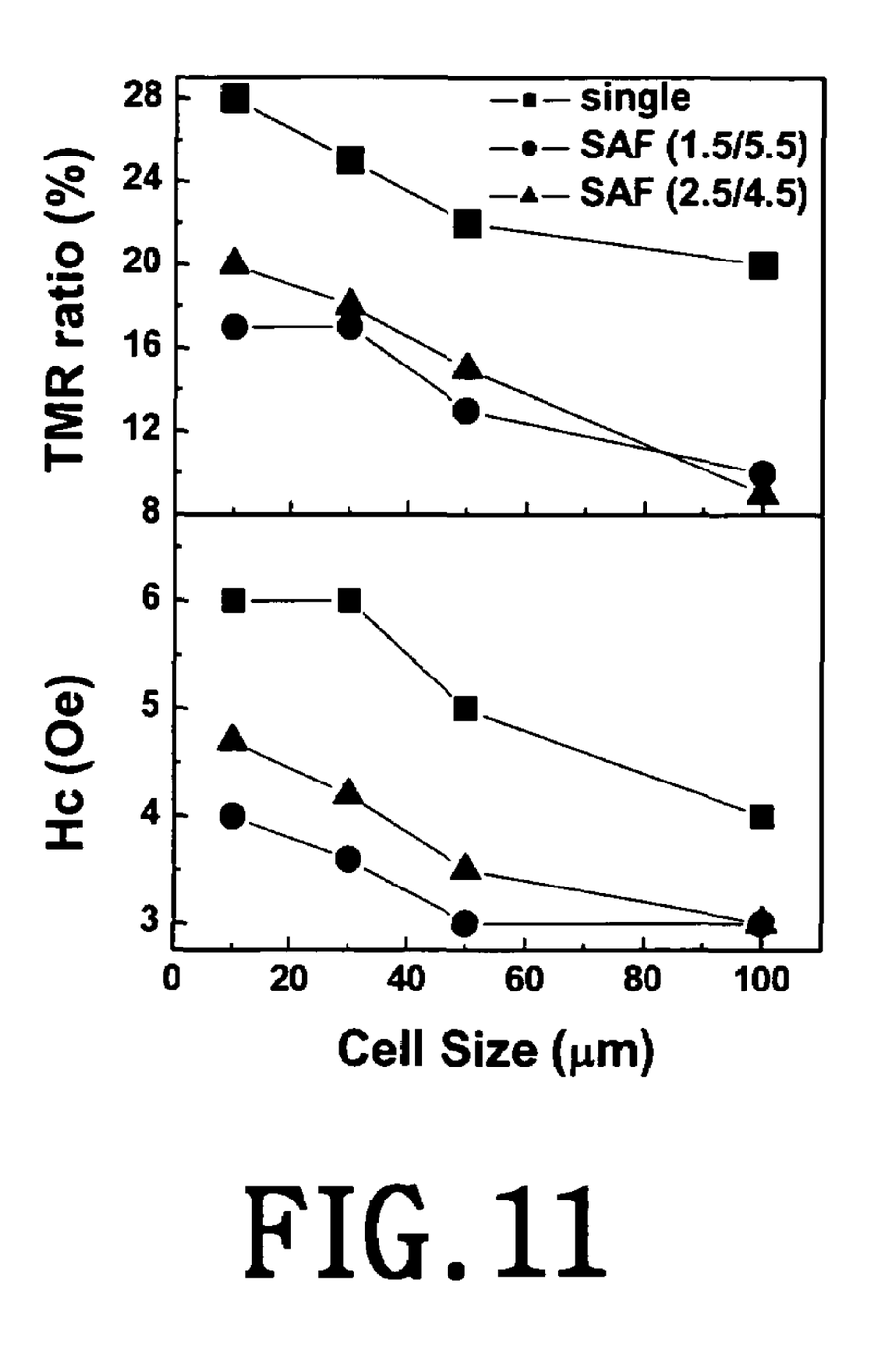
FIG. 11 is a graph illustrating change of a TMR ratio and switching field according to cell sizes of an MTJ structure with a CoFeSiB single free layer and an MTJ structure with a CoFeSiB/Ru/CoFeSiB SAF free layer.

FIG. 11 is a graph illustrating change of a TMR ratio and switching field according to cell sizes of an MTJ structure with a CoFeSiB single free layer and an MTJ structure with a CoFeSiB/Ru/CoFeSiB SAF free layer. The SAF structure has a thickness difference in two kinds of MTJs with NiFeSiB/Ru/NiFeSiB free layer, that is, CoFeSiB (2.5 nm)/Ru (1.0 nm)/CoFeSiB (4.5 nm) and CoFeSiB (1.5 nm)/Ru (1.0 nm)/CoFeSiB (5.5 nm). In the case of the CoFeSiB single free layer, a TMR ratio is 28% and a switching field ($H_{SW}$) is 6 Oe. In the case of the CoFeSiB (2.5 nm)/Ru (1.0 nm)/CoFeSiB (4.5 nm) SAF free layer, a TMR ratio is 20% and a switching field ($H_{SW}$) is 5 Oe. In the case of the CoFeSiB (1.5 nm)/Ru (1.0 nm)/CoFeSiB (5.5 nm) SAF free layer, a TMR ratio is 18% and a switching field ($H_{SW}$) is 4 Oe. In an entire band, the MTJ structure with the CoFeSiB (2.5 nm)/Ru (1.0 nm)/CoFeSiB (4.5 nm) SAF free layer and the MTJ structure with the CoFeSiB (1.5 nm)/Ru (1.0 nm)/CoFeSiB (5.5 nm) SAF free layer have lower TMR ratio and switching field than the MTJ structure with the CoFeSiB single free layer.

By providing the MTJ structures with the amorphous CoFeSiB single free layer or the amorphous CoFeSiB/Ru/amorphous CoFeSiB SAF free layer, the MTJ structures with the submicrometer-sized cells can have low switching field (4-6 Oe) and large TMR ratio (18-28%).

In addition, by providing the MTJ structures with the amorphous NiFeSiB single free layer or the amorphous NiFeSiB/Ru/amorphous NiFeSiB SAF free layer, the MTJ structures with the submicrometer-sized cells can have low switching field (6-8 Oe) and large TMR ratio (27-30%).

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. An MTJ (magnetic tunnel junction) comprising:
   a free layer including an amorphous $Ni_aFe_bSi_cB_d$/Ru/amorphous $Ni_aFe_bSi_cB_d$ layer wherein the composition of each said amorphous $Ni_aFe_bSi_cB_d$ is $11 \leq a \leq 21\%$, $57 \leq b \leq 67\%$, $3 \leq c \leq 13\%$, $9 \leq d \leq 19\%$;
   an intermediate layer formed of non-magnetic material on the free layer; and
   a pinned layer formed of a ferromagnetic layer on the intermediate layer.

2. The MTJ structure of claim 1, wherein a thickness ratio of the amorphous $Ni_aFe_bSi_cB_d$/Ru/amorphous $Ni_aFe_bSi_cB_d$ in the free layer is 2.0~2.5:0.5: 4.5~5.0.

* * * * *